United States Patent
Huang et al.

(10) Patent No.: US 6,770,138 B2
(45) Date of Patent: Aug. 3, 2004

(54) PATTERN FOR MONITORING EPITAXIAL LAYER WASHOUT

(75) Inventors: Shih-Feng Huang, Daun Chin (TW); Chih-Feng Huang, Chu-Pei (TW); Kuo-Su Huang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 84 days.

(21) Appl. No.: 10/047,379

(22) Filed: Jan. 14, 2002

(65) Prior Publication Data

US 2003/0131785 A1 Jul. 17, 2003

(51) Int. Cl.[7] .................. C30B 35/00; H01L 23/58; G01N 33/00
(52) U.S. Cl. .................. 117/201; 257/48; 73/866
(58) Field of Search .................. 73/865.9, 432.1, 73/866; 117/85, 200, 201; 29/705; 438/942, 945, 947, 18, 17, 14; 257/48; 324/763, 765; 430/5; 216/12

(56) References Cited

U.S. PATENT DOCUMENTS

| | | | | |
|---|---|---|---|---|
| 5,152,168 A | * | 10/1992 | Barlocchi et al. | 73/104 |
| 5,245,543 A | * | 9/1993 | Smayling et al. | 364/468 |
| 5,319,564 A | * | 6/1994 | Smayling et al. | 364/468 |
| 5,719,495 A | * | 2/1998 | Moslehi | 324/158.1 |
| 2002/0157485 A1 | * | 10/2002 | Cheong | 73/865.9 |

OTHER PUBLICATIONS

Wolf et al., "Silicon Processing for the VLSI Era vol.: 1 Process Technology", Lattice Press, Sunset Beach, CA, USA, pp. 143–145, 1986.*

* cited by examiner

Primary Examiner—Nadine G. Norton
Assistant Examiner—Matthew A. Anderson
(74) Attorney, Agent, or Firm—Tung & Associates

(57) ABSTRACT

A pattern for monitoring epitaxial layer washout is disclosed. The pattern includes first and second sub-patterns. The first sub-pattern has a shape and defines one or more minimum dimensions. Obfuscation of the first sub-pattern means that epitaxial washout has occurred at least for dimensions equal to or less than the minimum dimensions. The second sub-pattern has the same shape of the first sub-pattern, but defines one or more maximum dimensions. Obfuscation of the second sub-pattern means that epitaxial washout has occurred for dimensions equal to or less than the maximum dimensions. The sub-patterns can include a pair of separated features, such as a pair of interlocking but separated L-shaped features, the separation of which defines the dimensions of the sub-patterns.

20 Claims, 7 Drawing Sheets

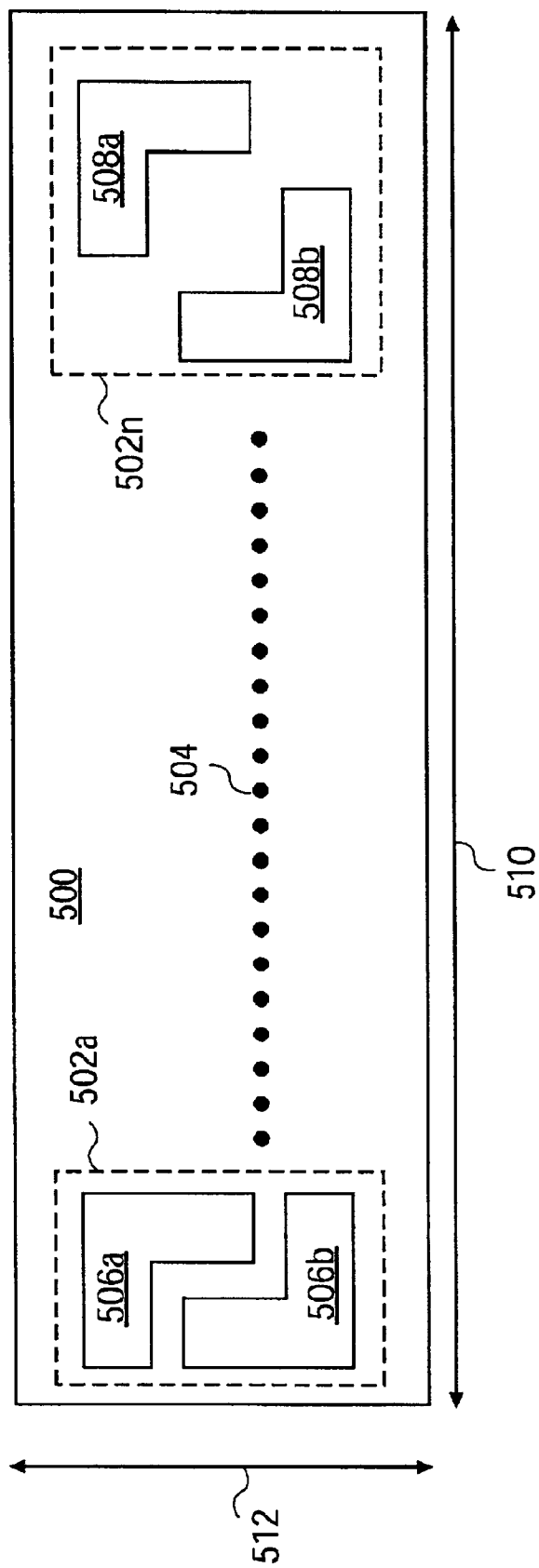

PATTERN FOR MONITORING EPITAXIAL LAYER WASHOUT

FIELD OF THE INVENTION

This invention relates generally to semiconductor processing, and more particularly to monitoring epitaxial layer washout within such processing.

BACKGROUND OF THE INVENTION

Patterning is one of the basic steps performed in semiconductor processing. It also referred to as photolithography, masking, oxide or metal removal, and microlithography. Patterning enables the selective removal of material deposited on a semiconductor substrate, or wafer, as a result of a deposition process. For example, as shown in FIG. 1A, a layer 104 has been deposited on a substrate 102. After the photolithography process is performed, as shown in FIG. 1B, some parts of the layer 104 have been selectively removed, such that gaps 106a and 106b are present within the layer 104. A photomask, or pattern, is used (not shown in FIG. 1B) so that only the material from the gaps 106a and 106b are removed, and not the other portions of the layer 104. The process of adding layers and removing selective parts of them, in conjunction with other processes, permits the fabrication of semiconductor devices.

Alignment is critical in photolithography and deposition, as well as in other semiconductor processes. If layers are not deposited properly, or if they are not selectively removed properly, the resulting semiconductor devices may not function, relegating them to scrap, which can be costly. Such misalignment, or overlay shift, is shown in FIG. 2. The layer 204 may or may not be deposited in a properly aligned configuration on the substrate 202, whereas subsequent deposition layers 206a, 206b, . . . , 206n are misaligned. This is indicated by the reference marks 210a, 210b, . . . , 210n, which are shown in FIG. 2 for illustrative clarity only. The reference marks 210a, 210b, . . . , 210n, should substantially align over the alignment marks 208 of the substrate 202, but they do not.

In comparison to FIG. 2, correctly aligned layers are shown in FIG. 3. The semiconductor wafer 202 has alignment marks 208. The layer 204 is aligned thereupon. Similarly, the layers 206a, 206b, . . . , 206n are deposited upon the layer 204, without any, or with minimal, overlay shift. This is indicated by the reference marks 210a, 210b, . . . , 210n aligning with the alignment marks 208 of the wafer 202.

Specific types of alignment problems can result when using epitaxial layers grown over a semiconductor substrate. Epitaxy is the process in which a thin layer of a single crystal material is deposited on a substrate. Epitaxial growth occurs in such a way that the crystallographic structure of the substrate is reproduced in the growing material, although the conductivity and the doping level of the epitaxial layer can be independent of the underlying substrate layer. Silicon substrates with epitaxial layers are commonly used in complementary metal-oxide silicon (CMOS) semiconductor devices, bi-CMOS devices, high-voltage devices, and bipolar devices.

FIGS. 4A, 4B, and 4C show the alignment problems that can occur within a pattern in an epitaxial layer relative to the pattern in a substrate layer. In FIG. 4A, pattern shift has occurred. The pattern 406 in the substrate layer 402 has shifted to the right as the pattern 408 in the epitaxial, or epi, layer 404. In FIG. 4B, pattern distortion has occurred. The pattern 436 in the substrate layer 438 has become distorted as the pattern 438 in the epi layer 434. That is, the pattern 438 is smaller in width than the pattern 436 is. In FIG. 4C, pattern washout has occurred. The pattern 466 in the substrate layer 462 has washed out as the pattern 468 in the epi layer 464. These sorts of alignment problems can occur because of non-ideal deposition of the epi layers, and/or because of other improper processing. The patterns of FIGS. 4A, 4B, and 4C can be alignment marks, used for alignment in the subsequent processing of the epi layers and other layers.

When the alignment problems of FIGS. 4A, 4B, and 4C occur, adjustment must be made to the position of features on subsequent layers in order to compensate for the errors introduced in the epi layers. Selecting the correct amount of adjustment, however, is usually complicated by the fact that the effects are dependent on such varying factors as substrate orientation, deposition rate, deposition temperature, and silicon source. Furthermore, in the case of pattern washout of FIG. 4C in particular, subsequent processing performed relative to the epi layer 464 will likely fail, because the semiconductor processing equipment will most likely not be able to align with the washed-out pattern 468. This alignment failure may be corrected by instead performing manual alignment, but this is a time-intensive and costly process.

Therefore, there is a need to be able to monitor epitaxial layer washout of alignment and other patterns. Such monitoring should be able to yield whether washout has occurred, so that it can be determined whether a given semiconductor wafer lot must be scrapped. Furthermore, such monitoring should be able to yield at what feature size washout has occurred, so that only the minimum number of semiconductor wafers is scrapped. For these and other reasons, there is a need for the present invention.

SUMMARY OF THE INVENTION

The invention relates to a pattern for monitoring epitaxial layer washout. The pattern includes first and second sub-patterns. The first sub-pattern has a shape and defines one or more minimum dimensions. Obfuscation of the first sub-pattern means that epitaxial washout has occurred at least for dimensions equal to or less than the minimum dimensions. The second sub-pattern has the same shape of the first sub-pattern, but defines one or more maximum dimensions. Obfuscation of the second sub-pattern means that epitaxial washout has occurred for dimensions equal to or less than the maximum dimensions.

The invention provides for advantages over the prior art. A series of sub-patterns may have decreasing dimensions at regular intervals. By proceeding down the series of sub-patterns, and determining the first sub-pattern of the series that is not clear—that is, which is obfuscated—a semiconductor technician can easily determine at which dimensions epitaxial layer washout has occurred. These dimensions are those that are equal to or less than the dimensions of the first sub-pattern of the series that is obfuscated. These dimensions can be referred to as the washout values for the epitaxial layer, and can include different horizontal and vertical dimensions, and hence washout values.

Still other advantages, embodiments, and aspects of the invention will become apparent by reading the detailed description that follows, and by referencing the attached drawings.

BRIEF DESCRIPTION OF THE DRAWINGS

FIG. 5 is a diagram of a pattern including a series of sub-patterns, by which monitoring of epitaxial layer washout can be accomplished, according to an embodiment of the invention.

DETAILED DESCRIPTION OF THE INVENTION

Figure 1A:
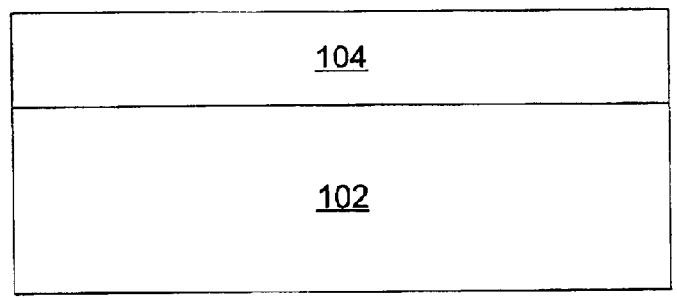
FIGS. 1A and 1B are diagrams showing the effect of patterning on a layer deposited on a semiconductor wafer.
Figure 1B:
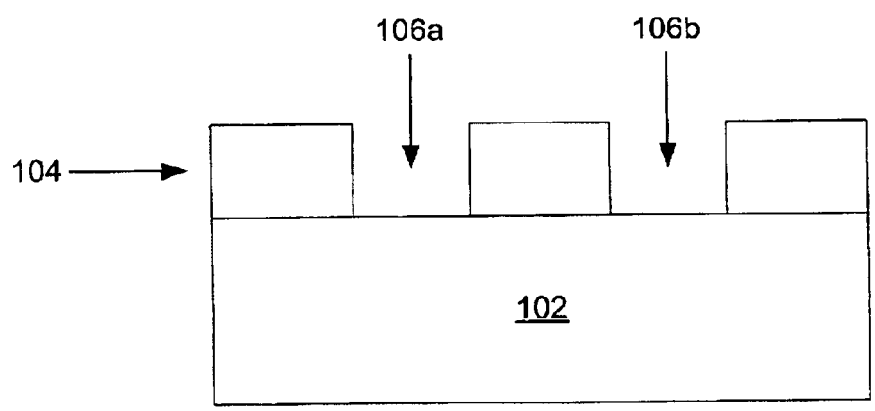
Figure 2:
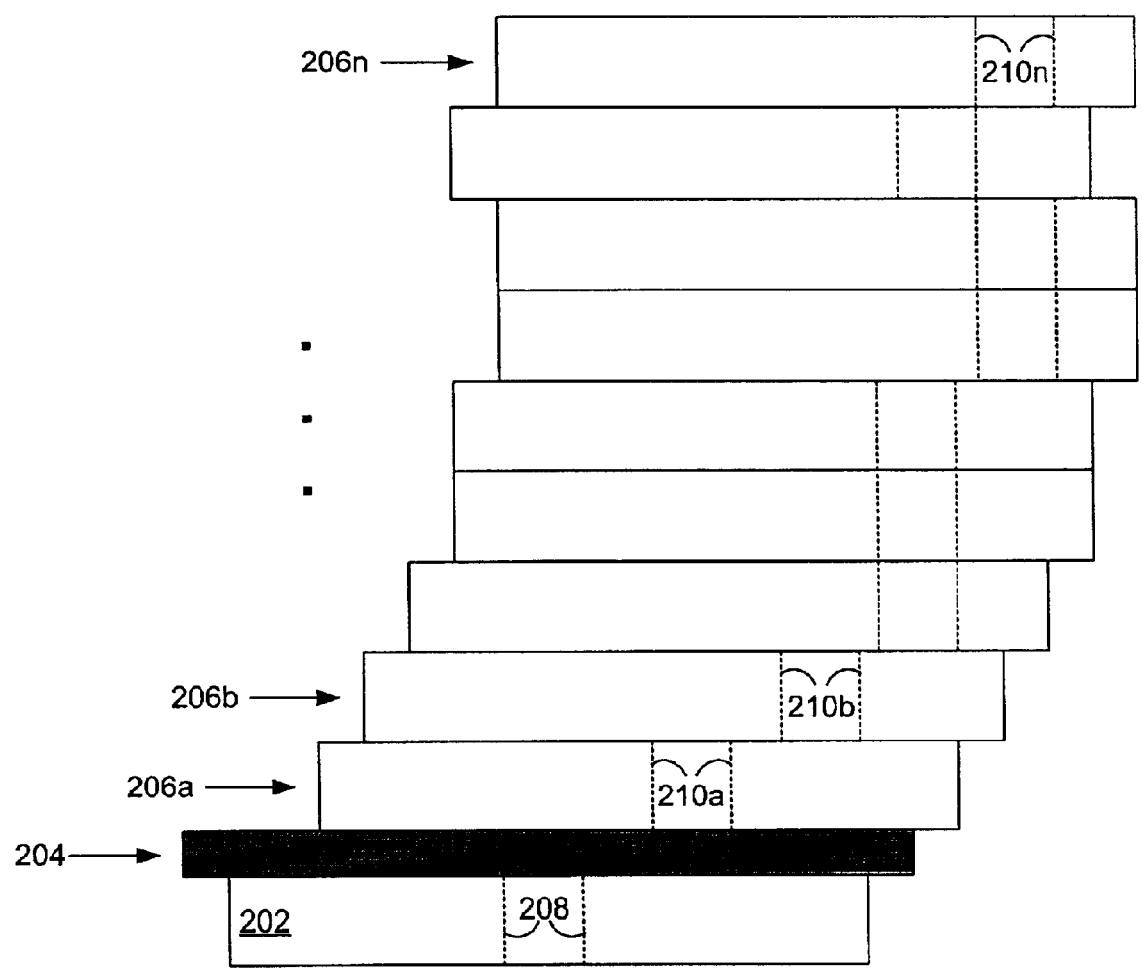
FIG. 2 is a diagram showing the overlay shift that results when depositing and exposing subsequent layers on a layer deposited on a semiconductor wafer.
Figure 3:
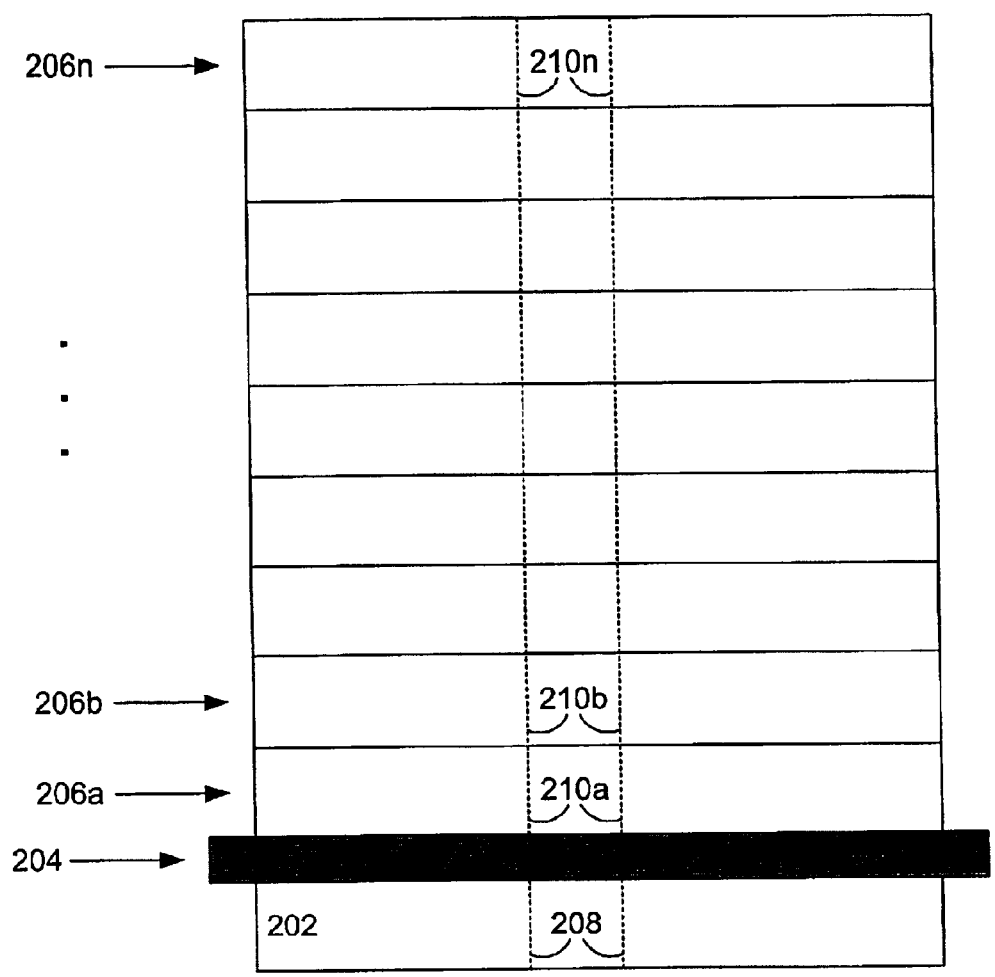
FIG. 3 is a diagram showing, in comparison to that of FIG. 2, how multiple deposited and exposed layers without overlay shift appear on a semiconductor wafer.
Figure 4A:
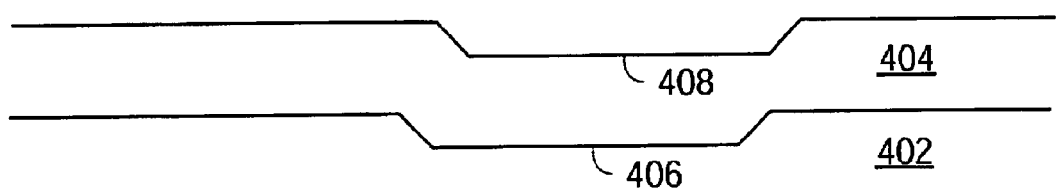
FIGS. 4A, 4B, and 4C are diagrams of pattern shift, pattern distortion, and pattern washout, respectively, that can problematically occur in epitaxial layers.
Figure 4B:
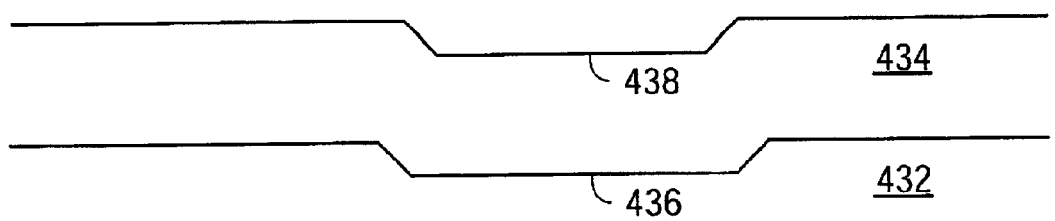
Figure 4C:
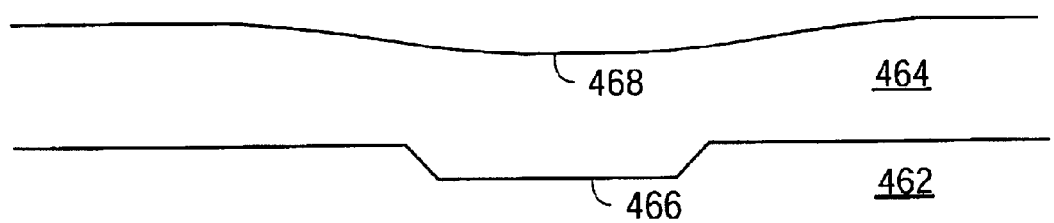

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

FIG. 5 shows a semiconductor pattern 500 for monitoring epitaxial layer washout. The pattern 500 is patterned on an epitaxial layer over a semiconductor substrate layer of a semiconductor wafer. For example, it may be patterned within the scribe lines of a wafer. Furthermore, there may be five sets of the pattern 500 within a given semiconductor mask. The pattern has a width 510 and a height 512, which can in one embodiment be equal to 1800 micron and 80 micron, respectively.

The pattern 500 includes a series of sub-patterns 502a ... 502n. Preferably, there are twelve such sub-patterns, including the sub-patterns 502a and 502n, where the dotted line 504 represents ten additional intermediary sub-patterns. The dimensions of the series of sub-patterns 502a ... 502n can be between 0.5 and 6.0 micron, increasing from the minimum of 0.5 for the sub-pattern 502a to the maximum of 6.0 for the sub-pattern 502n at regular intervals of 0.5 micron, such that the sub-patterns are uniformly spaced. The sub-pattern 502a has a given shape, and defines one or more minimum dimensions. After patterning on the epitaxial layer, if the sub-pattern 502a is obfuscated, this means that epitaxial washout has occurred for features having a size equal to or less than these minimum dimensions. The sub-pattern 502a specifically includes the separated features 506a and 506b.

The sub-pattern 502n has the same general shape as the sub-pattern 502a, and defines one or more maximum dimensions. After patterning on the epitaxial layer, if the sub-pattern 502n is obfuscated, this means that epitaxial washout has occurred for features having a size equal to or less than these maximum dimensions. The sub-pattern 502n specifically includes the separated features 506a and 506b. Similarly, the intermediary sub-patterns represented by the dotted line 504 each has the same general shape as the sub-pattern 502a, and defines one or more intermediary dimensions. After patterning on the epitaxial layer, if a given sub-pattern is obfuscated, this means that epitaxial washout has occurred for features having a size equal to or less than its intermediary dimensions.

Figure 6:
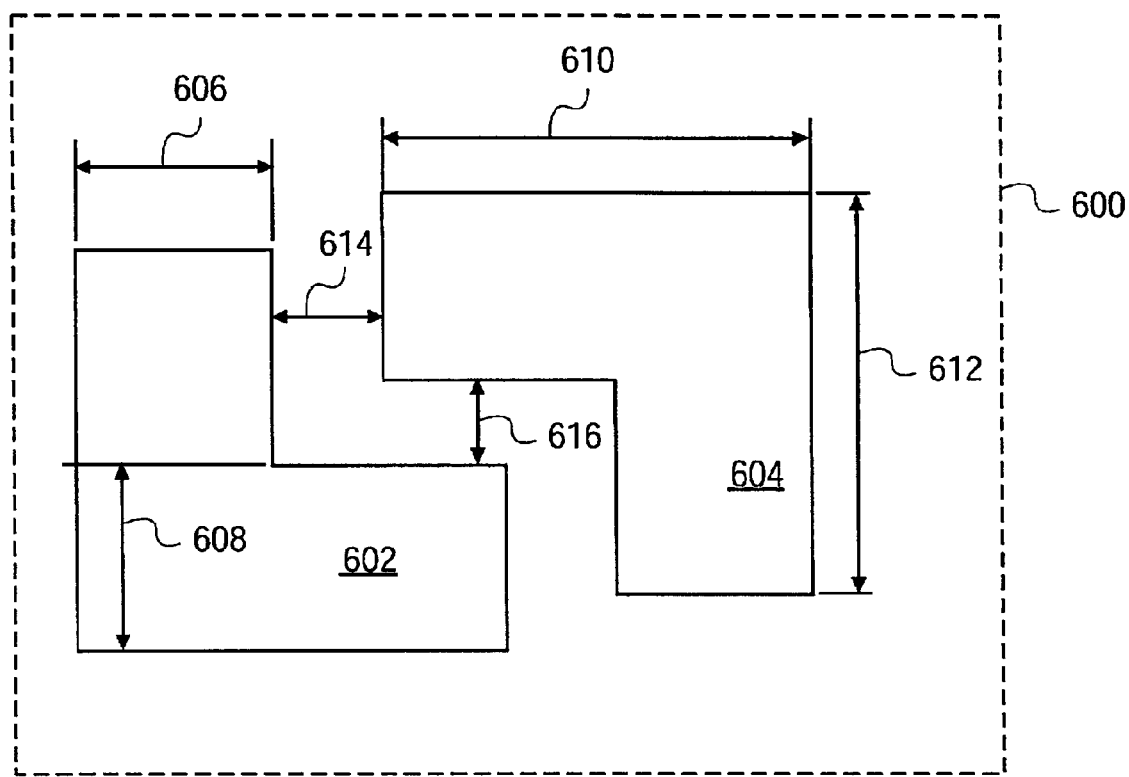
FIG. 6 is a diagram showing one of the sub-patterns of FIG. 5 in more detail, according to an embodiment of the invention.

FIG. 6 shows one of the sub-patterns of FIG. 5 in more detail, as the sub-pattern 600. The sub-pattern 600 includes features 602 and 604. The features 602 and 604 are interlocked or complementary, but separated, features, the latter in that they do not touch one another. As shown in FIG. 6, each of the features 602 and 604 is substantially L-shaped, in that each has two segments forming an L-shape. Preferably, each of the features 602 and 604 has the same size and is thus identical in shape, such that the feature 604 represents a 180-degree rotation of the feature 602. The dimensions 606, 608, 610, and 612 of the features 602 and 604 can be 30 micron, 30 micron, 60 micron, and 60 micron, respectively, in one embodiment.

The separation of the features 602 and 604 of the sub-pattern 600 defines the one or more dimensions defined by the sub-pattern 600. For instance, the dimension 614 is a horizontal dimension that separates the features 602 and 604, and specifically separates a vertical segment of the feature 602 from a horizontal segment of the feature 604. Similarly, and the dimension 616 is a vertical dimension that separates the features 602 and 604, and specifically separates a horizontal segment of the feature 602 from a vertical segment of the feature 604. A given sub-pattern 600 may thus have specific values for these dimensions 614 and 616, such as 4.0 micron for each. If after imprinting on the epitaxial layer the sub-pattern 600 is not clear—such that it is obfuscated—this indicates that feature dimensions of other features imprinted thereon of less than or equal to 4.0 micron will not be clear. That is, obfuscation indicates that epitaxial washout has occurred at this and lesser-sized dimensions.

Figure 7:
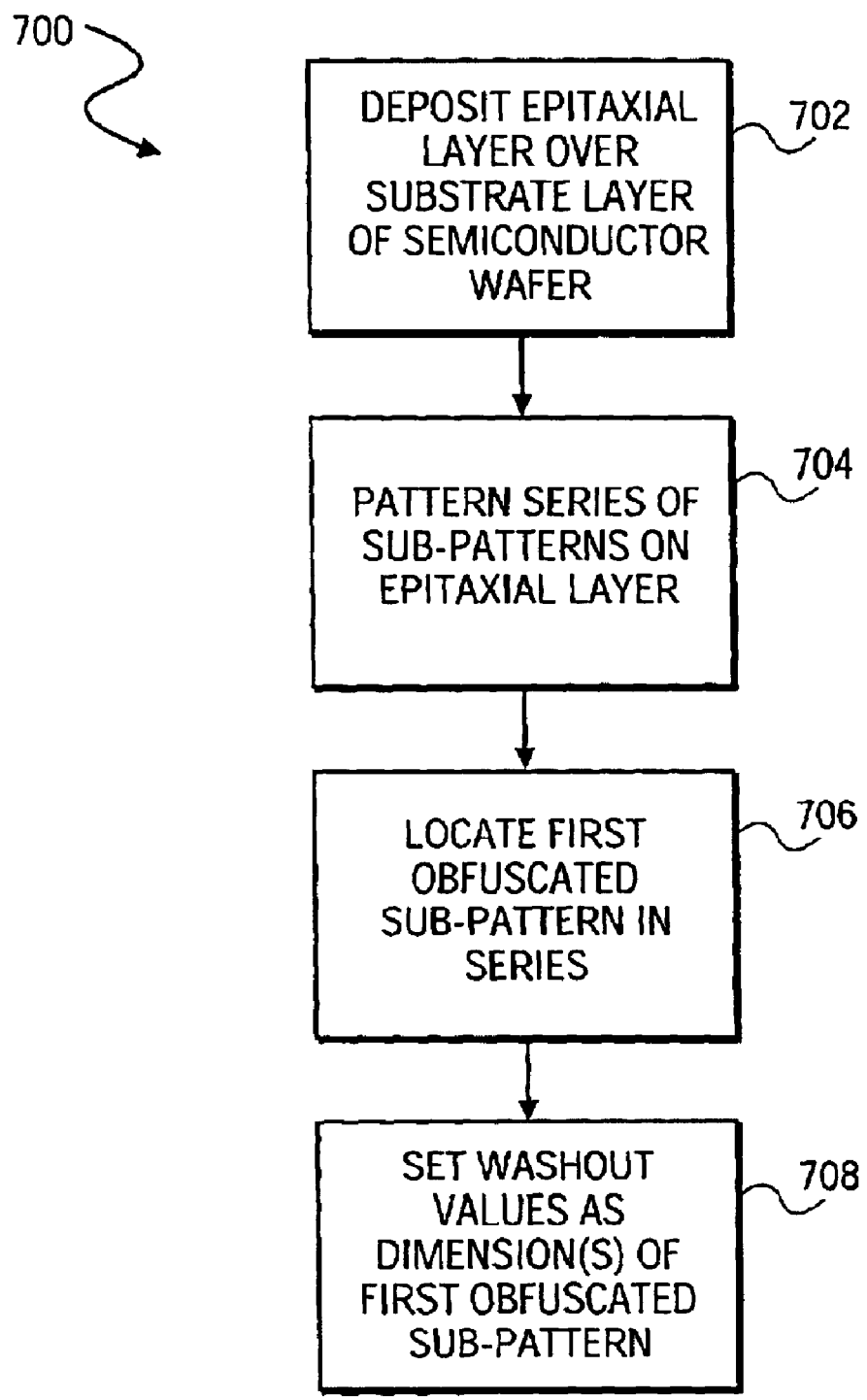
FIG. 7 is a flowchart of a method for monitoring epitaxial layer washout, according to an embodiment of the invention.

FIG. 7 shows a method 700 for monitoring epitaxial layer washout. First, an epitaxial layer is deposited over a substrate layer of a semiconductor wafer (702). For example, the epitaxial layer may be grown over the substrate layer. A series of sub-patterns is then patterned on at least the epitaxial layer (704). The series of sub-patterns can be and is preferably the series 502n ... 502a of FIG. 5. The series of sub-patterns defines progressively decreasing one or more dimensions, and this is why the series is indicated as the series 502n ... 502a of FIG. 5, since such an ordering represents progressively decreasing dimensions.

Next, the first obfuscated sub-pattern in the series is located (706), by starting at the sub-pattern having the maximum dimension(s), and proceeding through the series of sub-patterns and potentially to the sub-pattern having the minimum dimension(s). Finally, the washout values are set as the dimension(s) of this first obfuscated sub-pattern (708). These washout values indicate the dimension(s) at which epitaxial washout has occurred, such that dimensions equal to or less than these values are concluded to be washed out on the epitaxial layer. Other features patterned on the epitaxial layer having dimensions equal to or less than the washout values are thus washed out, too.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A pattern for an epitaxial layer over a semiconductor substrate layer, for monitoring epitaxial layer washout, the pattern for the epitaxial layer comprising:

a first sub-pattern having a shape and defining one or more minimum dimensions, obfuscation of the first sub-pattern indicating that epitaxial washout has occurred at least for dimensions equal to or less than the one or more minimum dimensions; and, a second sub-pattern having the shape of the first sub-pattern but defining one or more maximum dimensions, obfuscation of the second sub-pattern indicating that epitaxial washout has occurred for dimensions equal to or less than the one or more maximum dimensions.

2. The pattern of claim 1, further comprising one or more additional sub-patterns, each additional sub-pattern having the shape of the first sub-pattern but defining one or more intermediary dimensions greater than the one or more minimum dimensions and less than the one or more maximum dimensions, obfuscation of a given sub-pattern of the one or more additional sub-patterns indicating that epitaxial washout has occurred at least for dimensions equal to or less than the one or more intermediary dimensions of the given sub-pattern.

3. The pattern of claim 1, wherein the first sub-pattern comprises a pair of separated features, separation of which defines the one or more minimum dimensions.

4. The pattern of claim 3, wherein the pair of separated features is a pair of interlocking but separated L-shaped features.

5. The pattern of claim 1, wherein the second sub-pattern comprises a pair of separated features, separation of which defines the one or more maximum dimensions.

6. The pattern of claim 5, wherein the pair of separated features is a pair of interlocking but separated L-shaped features.

7. The pattern of claim 1, wherein the one or more minimum dimensions essentially consists of a horizontal dimension and a vertical dimension.

8. The pattern of claim 1, wherein the one or more maximum dimensions essentially consists of a horizontal dimension and a vertical dimension.

9. The pattern of claim 1, wherein the first sub-pattern comprises a pair of interlocking but separated L-shaped features, each of a first feature and a second feature of the pair including a first segment and a second segment, a distance between the first segment of the first feature and the first segment of the second feature defining a horizontal dimension of the one or more minimum dimensions, and a distance between the second segment of the first feature and the second segment of the second feature defining a vertical dimension of the one or more minimum dimensions.

10. The pattern of claim 1, wherein the second sub-pattern comprises a pair of interlocking but separated L-shaped features, each of a first feature and a second feature of the pair including a first segment and a second segment, a distance between the first segment of the first feature and the first segment of the second feature defining a horizontal dimension of the one or more maximum dimensions, and a distance between the second segment of the first feature and the second segment of the second feature defining a vertical dimension of the one or more maximum dimensions.

11. A method for monitoring epitaxial layer washout comprising:

patterning on an epitaxial layer over a semiconductor substrate layer a pattern including a series of sub-patterns defining a progressively decreasing one or more dimensions;

locating a first sub-pattern of the series that is obfuscated by proceeding through the series of sub-patterns, the first sub-pattern defining one or more first dimensions; and, setting one or more washout values as the one or more first dimensions of the first sub-pattern, such that dimensions less than the one or more washout values are concluded to be washed out on the epitaxial layer.

12. The method of claim 11, wherein the progressively decreasing one or more dimensions of the series of sub-patterns are uniformly spaced.

13. The method of claim 11, wherein each sub-pattern of the series of sub-patterns comprises a pair of separated features, separation of which defines one or more dimensions of the sub-pattern.

14. The method of claim 13, wherein the pair of separated features of each sub-pattern is a pair of interlocking but separated L-shaped features.

15. The method of claim 11, wherein one or more dimensions defined by each sub-pattern of the series of sub-patterns essentially consists of a horizontal dimension and a vertical dimension.

16. The method of claim 11, wherein each sub-pattern of the series of sub-patterns comprises a pair of interlocking but separated L-shaped features, each of a first feature and a second feature of the pair including a first segment and a second segment, a distance between the first segment of the first feature and the first segment of the second feature defining a horizontal dimension of one or more dimensions defined by the sub-pattern, and a distance between the second segment of the first feature and the second segment of the second feature defining a vertical dimension of the one or more dimensions defined by the sub-pattern.

17. The method of claim 11, further initially comprising depositing the epitaxial layer over the semiconductor substrate layer.

18. The method of claim 17, wherein depositing the epitaxial layer over the semiconductor substrate layer comprises growing the epitaxial layer over the semiconductor substrate layer.

19. A semiconductor wafer comprising:

a semiconductor substrate layer;

an epitaxial layer over the semiconductor substrate layer; and, a series of sub-patterns patterned on the epitaxial layer and having pairs of separated features, separation of which defines progressively decreasing one or more dimensions, wherein encountering obfuscation of a first sub-pattern of the series in proceeding through the series indicates that epitaxial washout has occurred for other features patterned on the epitaxial layer having dimensions equal to or less than one or more dimensions of the first sub-pattern.

20. The wafer of claim 19, wherein the pairs of separated features of the sub-patterns of the series are each a pair of interlocking but separated L-shaped features.

* * * * *